(12) United States Patent
Ammann

(10) Patent No.: US 6,367,678 B1
(45) Date of Patent: Apr. 9, 2002

(54) PROCESS FOR STACKING LAYERS THAT FORM A MULTILAYER PRINTED CIRCUIT

(75) Inventor: Beat Ammann, Sagno (CH)

(73) Assignee: Ballado Investments Inc., Nueva Urbanizacion Obarrio (PA)

( * ) Notice: Subject to any disclaimer, the term of this patent is extended or adjusted under 35 U.S.C. 154(b) by 0 days.

(21) Appl. No.: 09/551,884

(22) Filed: Apr. 18, 2000

(51) Int. Cl.[7] .............................................. B23K 31/12
(52) U.S. Cl. ............................ 228/103; 29/836; 29/840
(58) Field of Search .......................... 228/103; 29/840, 29/836; 361/748, 761

(56) References Cited

U.S. PATENT DOCUMENTS

| | | | | |
|---|---|---|---|---|
| 4,443,278 A | * | 4/1984 | Zingher | 156/64 |
| 4,578,279 A | * | 3/1986 | Zingher | 427/10 |
| 4,931,354 A | * | 6/1990 | Wakino et al. | 428/209 |
| 5,008,619 A | * | 4/1991 | Keogh et al. | 324/207.16 |
| 5,796,587 A | * | 8/1998 | Lauffer et al. | 361/763 |
| 5,850,109 A | * | 12/1998 | Mock et al. | 310/26 |
| 6,229,124 B1 | * | 2/2000 | Trucco | 219/605 |

FOREIGN PATENT DOCUMENTS

DE     196 18 254     10/1997

* cited by examiner

Primary Examiner—Tom Dunn
Assistant Examiner—L. Edmondson
(74) Attorney, Agent, or Firm—Young & Thompson

(57) ABSTRACT

A process for correctly positioning layers of a multilayer printed circuit. A flat closed circuit is attached peripherally on each layer. Each layer is arranged parallel to multiple circuits that are fixed on a reference board. An alternating current flows in one of the fixed circuits. The alternating current electromagnetically induces a current in the flat closed circuit, which in turn electromagnetically induces electromotive forces in other fixed circuits. The characteristic values of the electromotive forces are a function of the relative positions of the fixed circuits with respect to the flat, closed circuit. These values are used to correct the position of each layer on which the circuit is attached until each layer or parts of each layer are stacked in a predetermined position relative to at least parts of the fixed circuits. The corrected position is the position which each layer must maintain in the multilayer circuit. The layers are secured by hot soldering of interposed sheets of synthetic resin.

3 Claims, 3 Drawing Sheets

PROCESS FOR STACKING LAYERS THAT FORM A MULTILAYER PRINTED CIRCUIT

BACKGROUND OF THE INVENTION

This invention pertains to the technological sector that deals with the preparation and production of "multilayer" printed circuits, i.e., circuits that consist of a number of layers or flat boards stacked one on top of the other, to each of which is affixed a portion of the circuit, which circuit is implemented and made functional by assembling and outfitting the above-mentioned boards.

More specifically, above-mentioned "multilayer" printed circuits are made up of various layers stacked one on top of the other, each pair of which is a laminate that is made up of two sheets of copper that contain a spacer layer of dielectric material inserted between them.

Each layer is an actual circuit on which two faces are produced by photographic and chemical processes, the tracks and the pads.

Multilayer circuits are produced by soldering together a stack of layers one on top of the other with pre-preg sheets between them, a material composed of woven fiberglass and epoxy resin.

Production is done by successively stacking the layers in which mechanical references, holes, or pits have been made.

In order to estimate the total residual error of this method, allowance is made for the inherent error of mechanical pairing, as well as the error of the machine that produces it.

The standard recording error is never less than 100 microns.

On the outer layers are applied a resin sheet and then a sheet of copper, and then the stack is brought to a temperature and pressure such that it melts the resin that is inserted between the different layers, thus creating a single compact circuit that contains said layers.

The pads that are present in the various layers are traversed by holes which, once coated with metal, will ensure electrical continuity between the various layers. In order to ensure electrical continuity, one hole must pass through all of the pads that are present on the various layers.

The relentless drive toward higher circuit interconnection densities, which is due to the incessant development of new electronic components, is leading to a search for solutions that make it possible to make more tracks and more holes in a smaller area.

The decisive factors for increasing interconnection densities are the width of the tracks and the size of the holes.

Less apparent but still important are the sizes and positions of the pads.

The advantage of producing small-diameter holes is completely negated if, because the locations of the pads are not known, it is necessary to make them larger in order to be sure of connecting them all to a hole.

Since pads located on different layers have to be interconnected, it is necessary that the stacking of said layers be done in an extremely precise fashion.

In current embodiments, the circuit that is to be produced is brought to the drilling machine by means of two cylindrical pins that are inserted into two opposing holes made on the circuit. The positions of the pins must therefore be such as to guarantee proper drilling and thus proper interconnection of all the layers.

For this purpose an x-ray measurement is made of the positions of the references that are present on each layer that comprises the circuit.

The references may be pads or targets and may be stacked on top of one another or offset.

The hole for the pin is made at a location such as to guarantee the interconnection of the various pads (typically the barycenter of the machine, which is visible on x-rays in the case of opposing references, is selected).

The error depends on various factors, especially the measurement error that relates to the x-ray-table-TeleCamera system, and the drilling error. The standard error of this machine varies from 75 to 200 microns and thus has to be considered relevant.

SUMMARY OF THE INVENTION

The inventor of this invention has conceived of a new process that makes it possible to reduce significantly (by a factor of approximately 10) the order of magnitude of the multilayer circuit drilling and stacking error, thereby avoiding the need to take the above-mentioned x-ray measurements.

This process exploits the electromagnetic induction that is exerted between two flat circuits arranged in parallel, in one of which an alternating induction current of appropriate frequency is caused to flow; the voltage that is induced in the other circuit has an amplitude that relates to the amplitude of induction and to the characteristics that vary according to the relative positions between the two facing circuits.

By making the two above-mentioned facing circuits such that one is on a reference board (or slider) and the other is on each of the layers that are to be positioned, if there is an appropriate system for comparing and amplifying the characteristics of the induced voltages and the currents that flow, it is possible to record the position of each layer that is to be positioned in such a way that its circuit is superimposed on that of the slider in a preset relative position.

It is then possible from time to time to remove each perfectly oriented layer and transfer it by means of known precision moving devices that preserve its orientation with respect to the exact position that said layer must assume so that it can, along with the others, form the multilayer circuit that is to be produced.

The object of this invention is, as a matter of fact, a process for positioning relatively correctly a set of parallel stacked layers that constitute a multilayer circuit as described in the preamble to attached claim 1, characterized by the characterizing part of said claim.

A description will now be given of a preferred embodiment of the process of the invention, but this example should be neither considered limiting nor binding with respect to other implementations that can be produced by one skilled in the art based on the teachings contained in said claim 1.

BRIEF DESCRIPTION OF THE DRAWING

In this description reference will be made, for the sake of clarity, to the attached drawings, wherein.

DETAILED DESCRIPTION OF THE PREFERRED EMBODIMENTS

It will first be stated that a position translation system that takes advantage of this the same physical principle has been produced for many years now by the Ruhle Companies, Inc. (USA) and marketed under the name INDUCTOSYN (R) in the fields of missilery, robotics, long-range sighting, etc.

The invention consists therefore in having discovered the possibility of applying the principles of such a system to such an unrelated and different field as the production of multilayer printed circuits.

Figure 1:
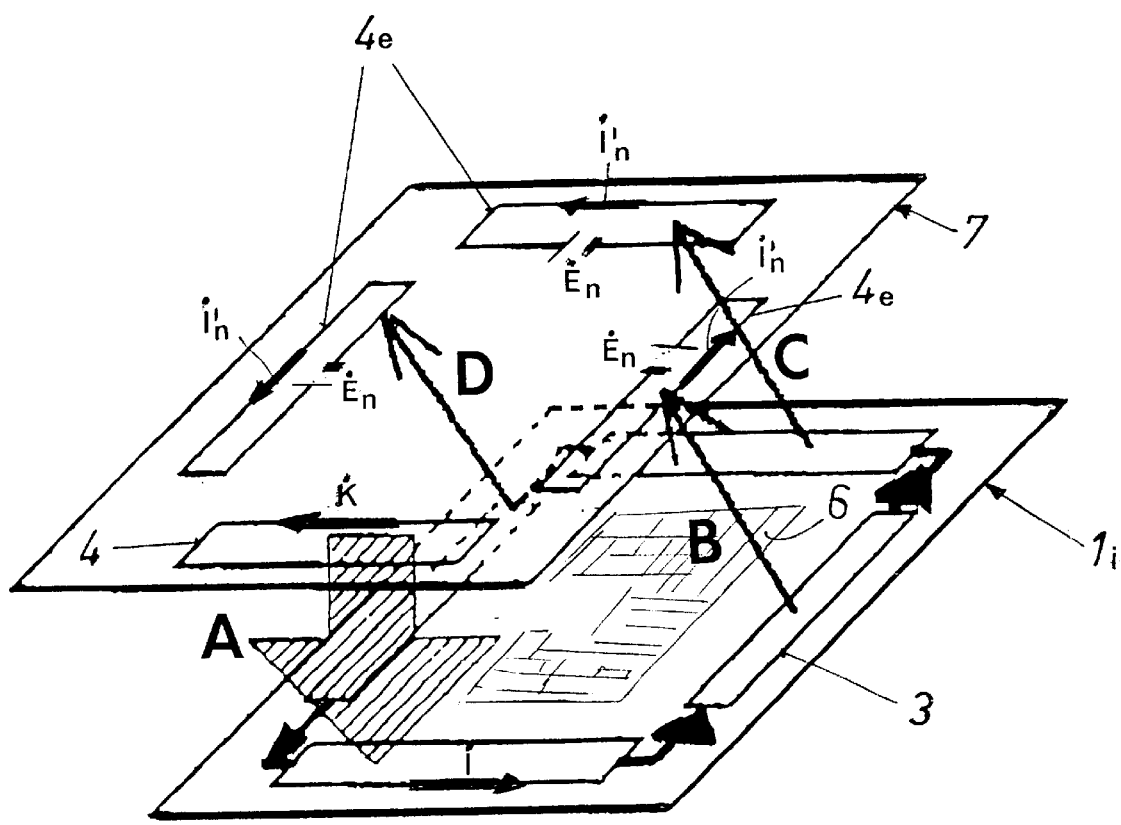
FIG. 1 shows a basic diagram of the process of the invention.
Figure 2:
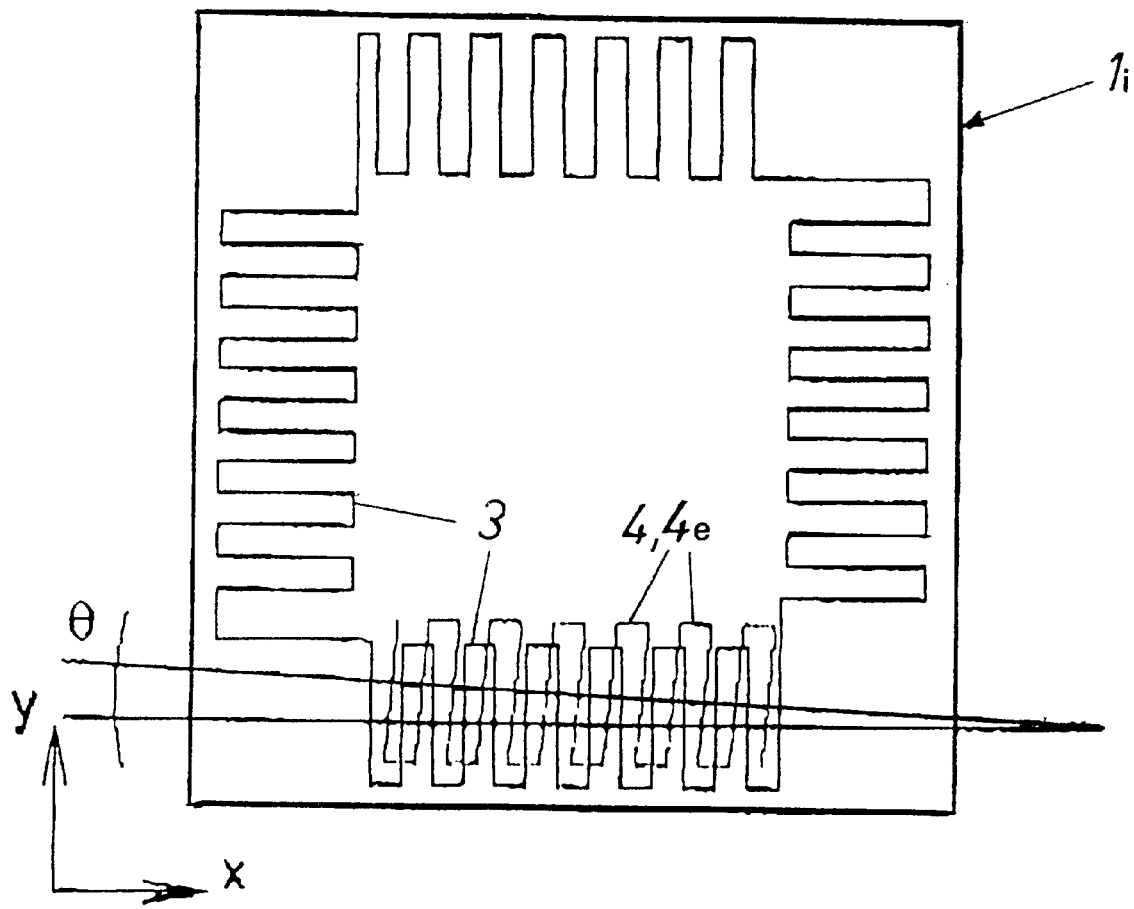
FIG. 2 shows a partially cutaway top view of two flat circuits that are arranged in parallel in order to determine and alter their relative position within the framework of the process in question.

If FIGS. 1, 2 are first examined, they show a layer 1$i$ and, resting on it, printed circuit 6, inside of which, arranged peripherally along the outer edges of layer 1$i$ itself, is a flat and continuous closed circuit 3, which is created on layer 1$i$ by known methods.

Arranged parallel to layer 1$i$ and created on a suitable substrate 7 is a set of multiple fixed circuits 4, 4$e$, which act as a positional reference. In one circuit 4 of said fixed circuits, an alternating current K of appropriate frequency is caused to flow, and said circuit 4 acts as a primary winding of a transformer that electromagnetically (arrow A) induces, in the part of closed circuit 3 that faces it, an induced alternating current I, which flows through entire closed circuit 3.

Said fixed circuits 4, 4$e$ all have at least one part that is made up of appropriately sized conductors that face the conductors that comprise said closed circuit 3, and current I therefore generates, by electromagnetic induction (arrows B, C, D), electromotive forces En (and currents In if said circuits are closed) in fixed circuits 4$e$ that are the objects to be measured.

The corresponding characteristic values (phase, amplitude, etc.) obviously vary depending on the ways in which the electromagnetic flux generated by closed circuit 3 is concatenated with respect to the lines of the conductors that form fixed circuits 4$e$ or depending on aberrations in relative rotation ($\phi$, FIG. 2) or translation relative to two Cartesian axes (indicated in FIG. 2).

In particular, maximum induced-current values (or values of the above-mentioned induced electromotive forces) are obtained when some lines of the conductors of fixed circuits 4$e$ and of closed circuit 3 are arranged exactly one on top of the other and all of the above-mentioned positional aberrations are equal to zero.

Thus, by using as a positional reference said substrate 7, which supports physical circuits 4, 4$e$, it is possible, using devices of known types, to detect and amplify the resulting characteristic electrical values and compare them to those of closed circuit 3 in order to determine the shift in these induced values relative to said circuit and thus the above-mentioned positional aberrations.

It is thus possible, using rotational-translational movements, to shift layer 1$i$, which supports closed circuit 3, until like features of facing conductors are stacked one on top of the other in a predetermined relative position, taking into account that better stacking can be obtained when the values of the maximum voltages En that are induced in physical circuits 4$e$ reach their highest levels.

Figure 3:
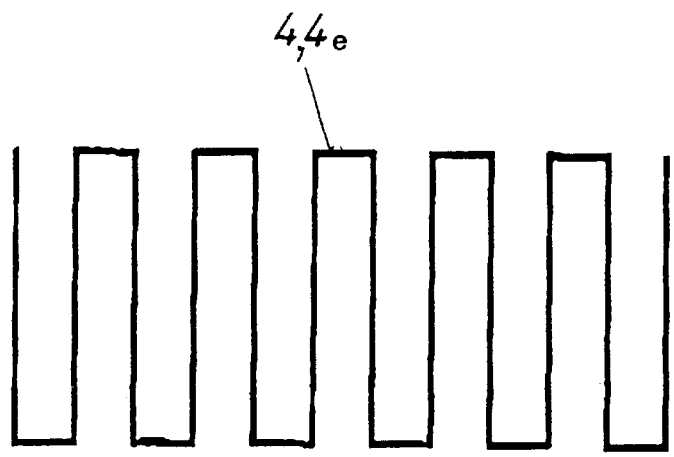
FIG. 3 shows a "Greek" pattern that is typical of a circuit that is especially well-suited for implementing the process.

It should be noted that, while in the drawing in FIG. 1 fixed circuits 4, 4$e$ and said closed circuit 3 are depicted generically with rectangular elements and are electrically connected only in closed circuit 3, in actuality the inventor proposes using, for all the parts of various stackable circuits 3, 4, 4$e$, an arrangement of the conductors in the "Greek" shape, i.e., as shown in FIG. 3.

The inventor also proposes, in order to ensure more accurate results, using "Greek" lines that are open at the ends as indicated in FIG. 3, to produce said fixed circuits 4, 4$e$ (so marked as they are applied to substrate 7, which acts as a fixed positional reference), thus detecting only the values and the wave shapes of the electromagnetic forces that are generated in them.

To make closed circuit 3, however, the inventor proposes using the shape depicted in FIG. 2, which is made up of several "Greeks", some or all of which can be stacked one on top of the "Greeks" mentioned above that constitute physical circuits 4, 4$e$.

Of course, in the case of closed circuit 3, as its very name indicates, the Greeks that comprise it must be electrically interconnected in series as indicated in FIGS. 1, 2.

Figure 4:
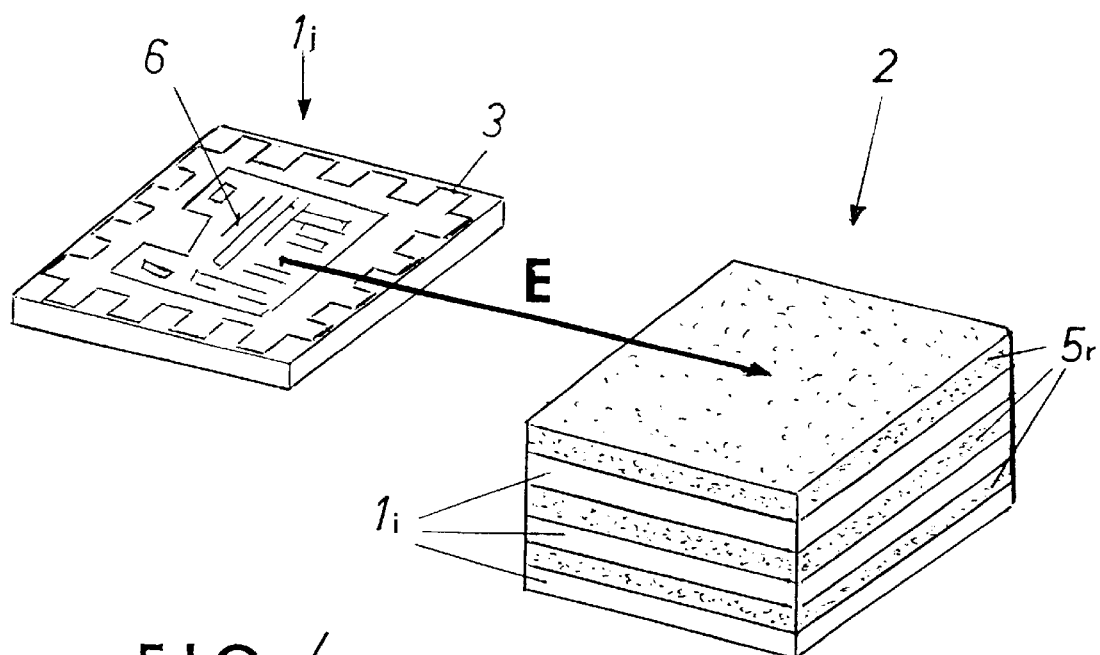
FIG. 4 shows a perspective schematic view of a multilayer circuit that is produced with the aid of oriented layers according to the process of the invention.

When it is found that this superior stacking has been achieved between closed circuit 3 and physical circuits 4, 4$e$, layer 1$i$ will have reached exactly the position in which it is to be inserted into a multilayer printed circuit 2 (see FIG. 4) and can then be transferred (arrow E) to the site where multilayer circuit 2 is assembled, using precision moving means of a known type that make it possible to move the circuit without altering its orientation relative to either the vertical or horizontal planes in even the slightest.

Since, as pointed out above, a multilayer circuit 2 is generally made up of multiple stacked layers in between which are inserted sheets 5$r$ of synthetic resin, the final attachment of multiple layers in, which are stacked on one another after having been properly positioned, can be done by hot soldering of the whole assembly.

Then a printed circuit 2 that is assembled according to the process of the invention can be subjected to multiple drilling operations in order to make it functional. With the process of the invention, as already indicated above, an accuracy of positioning with respect to various stacked layers 1$i$ is achieved that has margins of error 10 times smaller than those that apply to circuits that are assembled according to conventional methods, thereby achieving the goal that the inventor has set himself.

I claim:

1. A process for ensuring accurate relative positioning of multiple layers that are stacked one on top of the other in order to form a multilayer printed circuit comprising the steps of:

providing at least one flat continuous closed circuit on an outermost peripheral edge of each of said multiple layers;

arranging at least one fixed circuit parallel to and facing said at least one closed circuit, said at least one fixed circuit being applied to a reference substrate, said at least one fixed circuit has at least a portion facing a portion of said at least one closed circuit;

injecting an alternating current of a desired frequency into said at least one fixed circuit, said alternating current generating, by electromagnetic induction, an induced current that flows in said at least one closed circuit;

determining characteristic values of electromotive forces and/or currents, said electromotive forces and/or said currents being electromagnetically induced by said induced current in said at least one fixed circuit;

executing a rotational or a translational displacement of each of said multiple layers relative to said at least one fixed circuit, said characteristic values indicating that said portion of said at least one fixed circuit is facing said portion of said at least one closed circuits in a predetermined position;

picking up and transferring each of said layers of said multiple layers, without altering an angular orientation with respect to a vertical and a horizontal plane, to an insertion position to form said multilayer printed circuit; and attaching each of said layers to form parallel stack layers of said multilayer printed circuit.

2. The process according to claim 1, further comprising the steps of:

inserting a synthetic resin sheet between each pair of parallel layers; and melting said synthetic resin sheet by a hot soldering operation to attach the multiple layers that form the multilayer printed circuit.

3. The process according to claim 2, wherein said inserting step comprises inserting a material made up of fiberglass and an epoxy resin as said synthetic resin.

* * * * *